United States Patent
Pividori et al.

(10) Patent No.: US 6,812,098 B2
(45) Date of Patent: Nov. 2, 2004

(54) METHOD FOR MANUFACTURING NON-VOLATILE MEMORY DEVICE

(75) Inventors: Luca Pividori, Curno (IT); Carmen Calareso, Sesto San Giovanni (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 8 days.

(21) Appl. No.: 10/439,275

(22) Filed: May 15, 2003

(65) Prior Publication Data

US 2004/0002192 A1 Jan. 1, 2004

(30) Foreign Application Priority Data

May 16, 2002 (EP) ............................................ 02425311

(51) Int. Cl.$^7$ .......................................... H01L 21/336
(52) U.S. Cl. ....................................................... 438/257
(58) Field of Search .......................... 438/257; 257/315, 257/390

(56) References Cited

U.S. PATENT DOCUMENTS 5,899,713 A    5/1999 Acocella et al. ............ 438/201
6,034,416 A    3/2000 Uehara et al. .............. 257/623
6,426,237 B2 * 7/2002 Jech et al. ..................... 438/48

FOREIGN PATENT DOCUMENTS

| EP | 0710979 | 5/1996 | ....... H01L/21/3105 |
| EP | 0822598 | 2/1998 | ......... H01L/27/105 |
| WO | 00/38237 | 6/2000 | ......... H01L/37/105 |

* cited by examiner

Primary Examiner—David S. Blum
(74) Attorney, Agent, or Firm—Lisa K. Jorgenson; Allen, Dyer, Doppelt, Milbrath & Gilchrist, P.A.

(57) ABSTRACT

A method of manufacturing a non-volatile memory device includes depositing a first layer on a semiconductor substrate, and a portion of the first layer is selectively removed to form a memory array area. A second layer is deposited on the memory array area and on adjacent areas of the semiconductor substrate contacting the memory array area. The second layer has a thickness that is substantially equal over the memory array area and over the adjacent areas. The method further includes forming a screening layer on the second layer on the adjacent areas except for outer peripheral portions thereof adjacent the memory array area. The thickness of the second layer exposed on the memory array area and on the outer peripheral portions of the adjacent areas is reduced so that a resulting thickness is less than a thickness of the first layer.

24 Claims, 2 Drawing Sheets

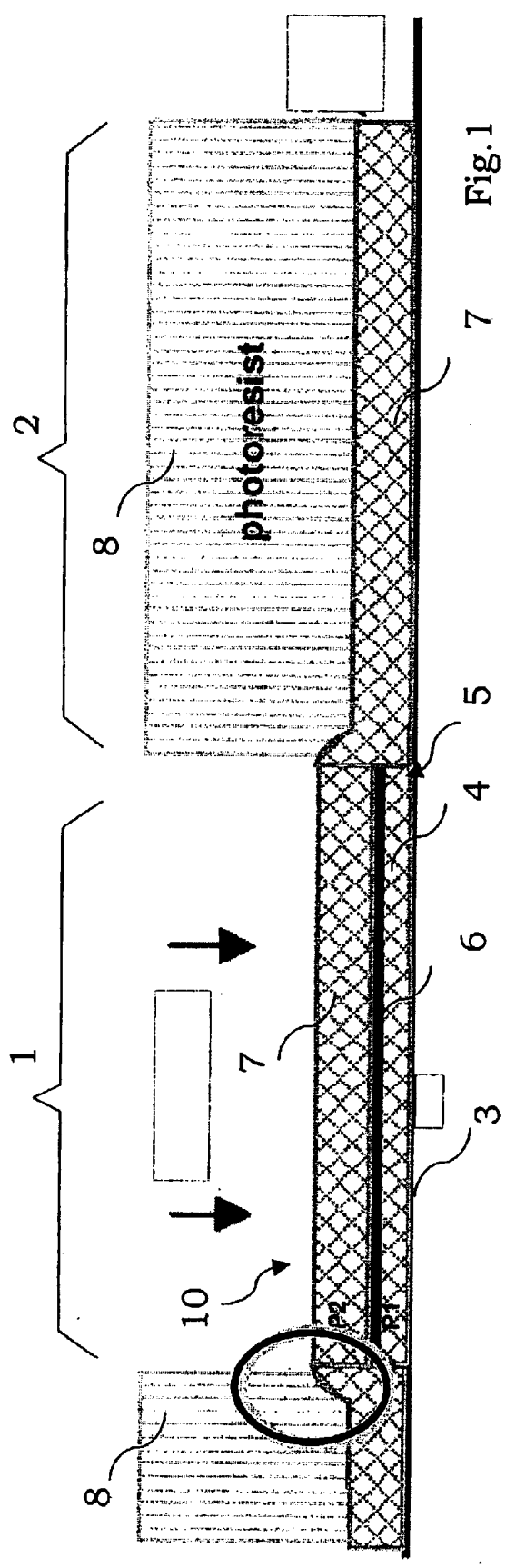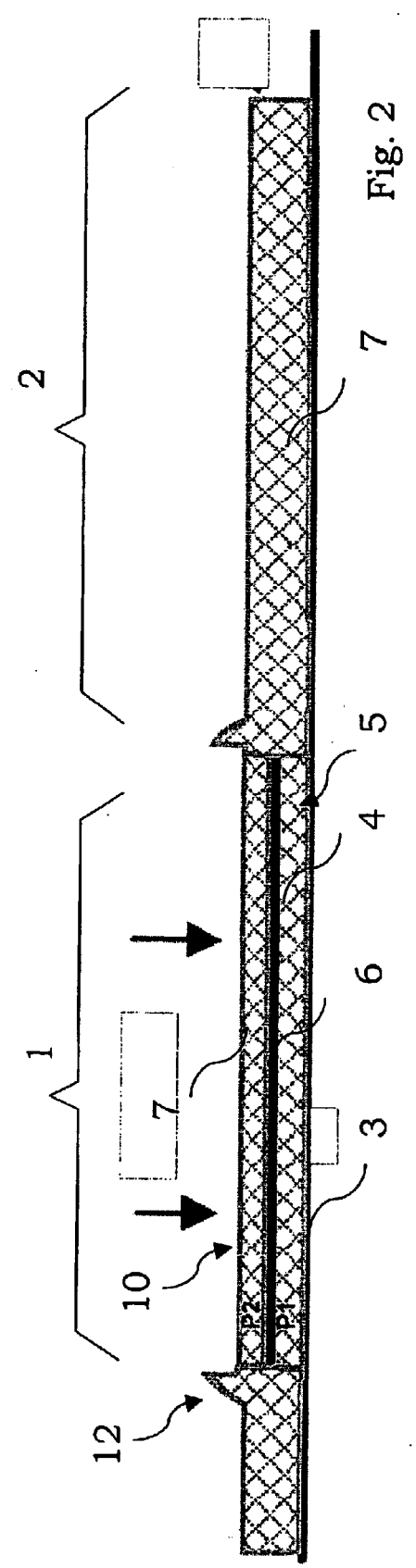

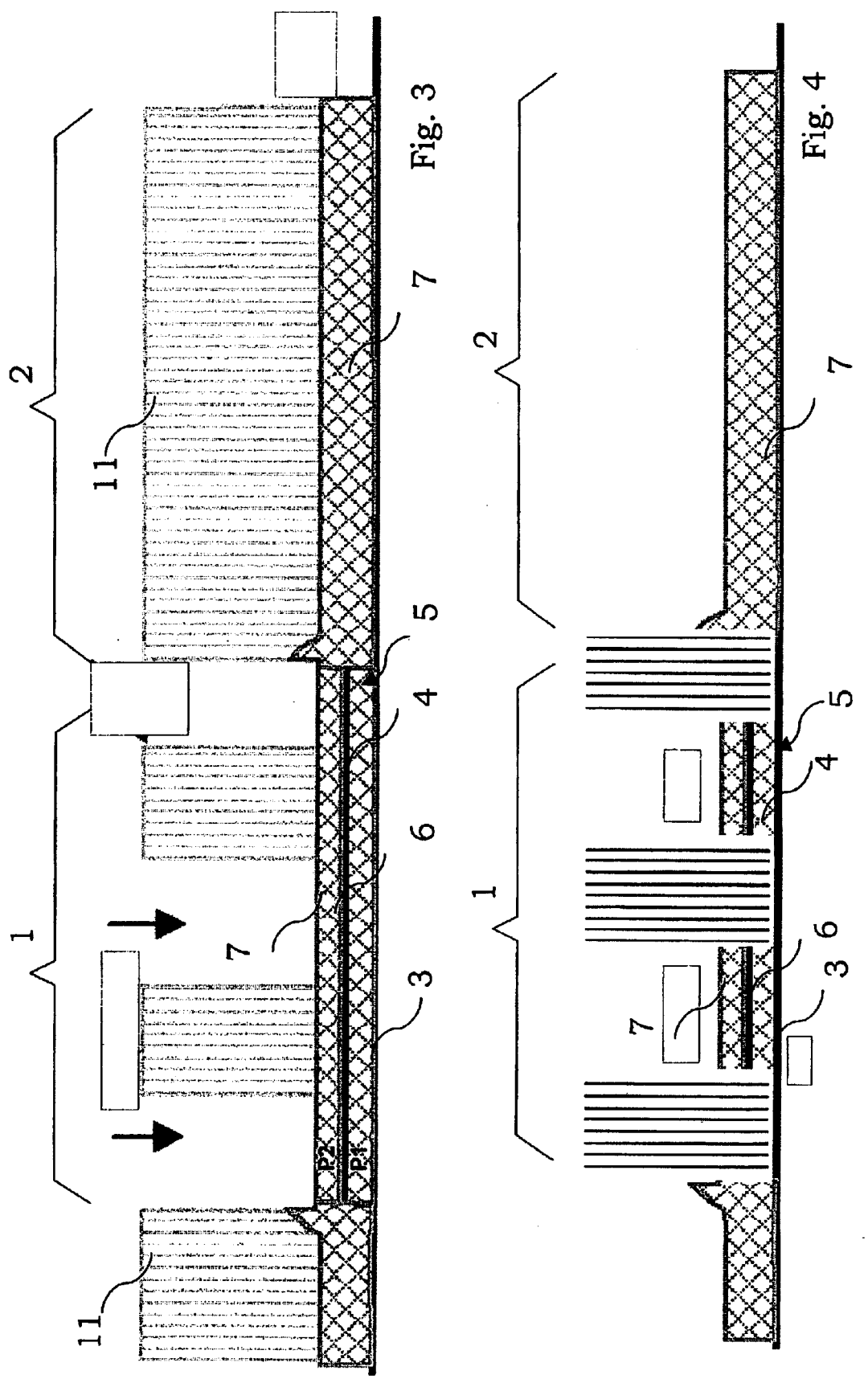

METHOD FOR MANUFACTURING NON-VOLATILE MEMORY DEVICE

FIELD OF THE INVENTION

The present invention relates to a method of manufacturing non-volatile memory devices. Although not limiting, the present invention relates in particular to a method for improving the planarity of semiconductor integrated electronic devices, such as the polysilicon gate electrode defined during the manufacturing process of the non-volatile memory. The following description makes reference to this field of application for convenience of illustration only.

BACKGROUND OF THE INVENTION

As is well known to those skilled in the art, electronic non-volatile memory devices, such as flash memories, for example, are integrated in a semiconductor substrate and comprise a plurality of non-volatile memory cells arranged as an array. Specifically, the array is made up of rows (or wordlines) and columns (or bitlines).

Each non-volatile memory cell comprises a MOS transistor having a floating gate electrode. The floating gate electrode is located above a channel region, and has a high DC impedance to the other terminals of both the memory cell and of the host circuit for the memory cell.

The memory cell has a second or gate control electrode capacitively coupled to the floating gate electrode through an intermediate dielectric layer, known as an interpoly layer. The second electrode of the memory cell is driven by appropriate control voltages. Other transistor electrodes of the memory cell are the drain and source terminals.

In general, the memory cell array has associated therewith control circuitry that includes a conventional MOS transistor, which has source and drain regions separated by a channel region. A gate electrode is also formed over the channel region and is isolated from the latter by a gate oxide layer.

The process steps for manufacturing a memory array and its circuitry includes forming active areas for the memory array and circuitry; growing an active oxide layer (known as the tunnel oxide) over the active areas; and depositing a first polysilicon layer on the whole device.

The process further includes defining floating gate electrodes in the array region; depositing a dielectric or interpoly layer, e.g., ONO (Oxide/Nitrate/Oxide); and forming a photolithographic mask, referred to as the MATRIX mask, on the memory array for etching through the interpoly layer and the first polysilicon layer of the circuitry.

The process further includes growing one or more active gate oxides over both the circuitry and the memory array; depositing a second polysilicon layer; defining the control gate electrodes of the array cells in the second polysilicon layer by exposing through a SAE (Self-Aligned Etch) mask; defining the gate electrodes of the transistors in the circuitry by exposing through the circuitry mask; and forming the transistor source and drain regions and metal layers.

In this way, the memory cell transistors comprise two polysilicon layers which are formed thicker than the circuitry transistors. In particular, when memory devices are formed with technologies that effectively define dimensions of 0.15 μm or less, the difference in thickness between the array regions where the memory cells are formed and the circuitry regions where the control devices are formed becomes more and more substantial.

In particular, the thickness of the second polysilicon layer, which is deposited on the first polysilicon layer to form the control gate electrodes of the memory cells and the gate electrodes of the circuitry transistors formed simultaneously therein, will be much smaller then the combined layers that are deposited to form a memory cell.

In a flash memory cell, the overall thickness of the stack structure, which includes the tunnel oxide layer, the first polysilicon layer, the interpoly dielectric layer, and the second polysilicon layer may be approximately 4100 Å. A thickness of the stack structure of the circuitry, which includes the gate oxide layer and the second polysilicon layer is approximately 2600 Å.

Therefore, the array has a thickness increase of about 1500 Å over the circuitry area. This difference creates a "step" between the array and the circuitry structure, which does not allow for a uniform spread over the device regions of subsequently applied layers, such as anti-reflective BARC layers or light-sensitive material layers used to define the polysilicon layers of the memory cells.

On account of these thickness differences on the device, some regions of uniform thickness will be formed where the required lithographic dimensions can be correctly defined for the memory cells, and some regions of non-uniform thickness will be formed where local lithographic focusing problems can be observed. The result is a memory cell gate electrode whose dimensions are different from the specification, such as being narrower than is required for proper performance of the device.

In this situation, reliability of the device is lost in significant amounts, and is enough to induce rejection of the device which results in an increase in the yield loss during the testing stage. It can be appreciated, therefore, that a difference in thickness between circuit structures can hinder (dimension-wise) a correct definition of each portion in the broad region where the memory array is formed. As just mentioned, this difference in thickness can be due to different steps of the manufacturing process.

SUMMARY OF THE INVENTION

The underlying technical problem of the present invention is to provide a method of manufacturing circuit structures having features appropriate for ensuring a uniform thickness over several portions of an electronic circuit, and to overcome the limitations and/or shortcomings of the prior devices.

The method of the present invention is one of carrying out an etching step on circuit structures having a greater thickness than the other circuit structures, whereby the thickness of the former can be reduced and made uniform with the thickness of the integrated circuit.

The method of manufacturing a non-volatile memory device in accordance with the present invention comprises depositing a first layer on a semiconductor substrate, selectively removing a portion of the first layer to form a memory array area, and depositing a second layer on the memory array area and on adjacent areas of the semiconductor substrate contacting the memory array area. The second layer may have a thickness that is substantially equal over the memory array area and over the adjacent areas. The method may further include forming a screening layer on the second layer on the adjacent areas except for outer peripheral portions thereof adjacent the memory array area. The thickness of the second layer exposed on the memory array area and on the outer peripheral portions of the adjacent areas is reduced so that an upper surface thereof is substantially coplanar with an upper surface of the second layer on the adjacent areas.

A dry etching may be used to reduce the thickness of the second layer. The method may further comprise removing the screening layer, and the remaining outer peripheral portions of the adjacent areas form protrusions that serve as barriers for the memory array area when subsequent layers are formed.

A dielectric layer may be formed on the semiconductor substrate before the first layer is formed, and another dielectric layer may be formed on the first layer before the second layer is formed. The first and second layers may each comprise a polysilicon layer. The method may further comprise forming in the first layer of the memory array area floating gate regions for memory cells, and forming in the second layer of the memory array area control gate regions for the memory cells.

BRIEF DESCRIPTION OF THE DRAWINGS

The features and advantages of the method of this invention will be apparent from the following description, given by way of a non-limitative example with reference to the accompanying drawings. In the drawings:

FIGS. 1 to 4 are respective schematic sectional views of a portion of an integrated circuit during the successive steps of the method according to the present invention.

DETAILED DESCRIPTION OF THE PREFERRED EMBODIMENTS

The processing steps described herein are not exhaustive of an integrated circuit manufacturing process. The present invention can be implemented with techniques that are conventional in the manufacturing of integrated circuits, and certain conventional manufacturing steps useful in disclosing the invention will be considered below.

The cross-sectional views provided by the drawings to illustrate portions of an integrated circuit during its manufacturing process are not drawn to scale, but rather to delineate major features of the invention. A method of manufacturing non-volatile memory devices will now be described with reference to the drawings.

As stated above, electronic non-volatile memory devices, e.g., flash memories, integrated in a semiconductor substrate, comprise a plurality of nonvolatile memory cells laid out as an array of such cells. The cells are arranged in rows or wordlines and columns or bitlines. Each non-volatile memory cell comprises a MOS transistor having, located above its channel region, a floating gate electrode. This electrode has a high DC impedance with respect to all of the other terminals of the memory cell and of the memory cell host circuit.

The memory cell also has a second or gate control electrode capacitively coupled to the floating gate electrode through an intermediate dielectric layer, known as the interpoly layer. The second electrode of the memory cell is driven by appropriate control voltages. Other transistor electrodes are the drain and source terminals.

In the state of the art, the memory cell array is associated with control circuitry that includes conventional MOS transistors, each having source and drain regions separated by a channel region. A gate electrode is also formed over the channel region and is isolated from the latter by a gate oxide layer.

The process steps for manufacturing the memory array 1 and its circuitry 2 include the following: forming active areas for the memory array 1 and circuitry 2; growing an active oxide layer 3, known as tunnel oxide, over the active areas; depositing a first polysilicon layer 4 on the whole device; defining floating gate electrodes 5 for the memory array 1 in the first polysilicon layer 4; and depositing a dielectric or interpoly layer 6, e.g., of ONO (Oxide/Nitrate/Oxide).

The process further includes forming a photolithographic mask, referred to as the MATRIX mask, on the memory array 1 for etching the interpoly layer and first polysilicon layer away from the circuitry; growing at least one active gate oxide layer over the circuitry 2; and depositing a second polysilicon layer 7 on both the circuitry 2 and the memory array 1, thereby providing control gate regions 9 of the memory cells and gate regions of the circuitry transistors.

According to the present invention, a photolithography mask 8 is formed at this step which will cover the circuitry 2 except for a portion 10 thereof, aligned to the memory array 1 of the polysilicon layer 7, as shown in FIG. 1. This mask 8 advantageously leaves uncovered also an outer peripheral portion of the memory cell array 1. This mask 8 forms a screening layer for the polysilicon layer 7.

An etching operation is then performed on the second polysilicon layer 7. This will reduce the thickness of the second polysilicon 7 and, hence, that of the whole memory cell in the array. Advantageously in this invention, approximately one third the thickness of the second polysilicon layer 7 is removed. A dry etch is advantageously applied to the second polysilicon layer 7. The mask 8 is then removed as shown in FIG. 2.

The memory device manufacturing process of the invention is now continued conventionally to form a self-aligned etching mask 11 as shown in FIG. 3. Thereafter, a conventional etching step is carried out to define the floating gate electrodes of the memory cells, as shown in FIG. 4. Conventional processing steps will ultimately form finished memory cells and circuitry transistors.

Advantageously, the etching should leave protrusions or protuberances 12 on the second polysilicon layer 7 at the memory array periphery. Such protrusions are not removed during the etching step because they are screened by the mask 8. These protrusions can be advantageously utilized as a barrier for the layers later to be deposited.

Summarizing, the method of the present invention allows the thickness of the second polysilicon layer to be reduced, so that any non-uniformity of the layer and from the underlying structures can be smoothed away. The problems in photolithographically defining the next layers due to a different thickness of the underlying layer are advantageously removed.

In particular, the process of the present invention is advantageous, especially when only portions of the electronic device require smoothing. In the latter respect, the invention enables selective etching of the structures to be leveled off. By such selective etching, both a layer thickness to be attenuated and the size of the layer portion affected by the removal can be accurately controlled.

Although reference is made in the above description to memory cell formations that comprise a floating gate transistor, the process of this invention is also useful where other areas of circuit structures provided in an integrated circuit require smoothing.

What is claimed is:

1. A method of manufacturing non-volatile memory device comprising:

depositing a first layer on a semiconductor substrate;

selectively removing a portion of the first layer to form a memory array area;

depositing a second layer on the memory array area and on adjacent areas of the semiconductor substrate contacting the memory array area, the second layer having a thickness that is substantially equal over the memory array area and over the adjacent areas;

forming a screening layer on the second layer on the adjacent areas except for outer peripheral portions thereof adjacent the memory array area; and reducing the thickness of the second layer exposed on the memory array area and on the outer peripheral portions of the adjacent areas so that a resulting thickness is less than a thickness of the first layer.

2. A method according to claim 1, wherein reducing the thickness of the second layer comprises dry etching the exposed second layer.

3. A method according to claim 1, wherein reducing the thickness of the second layer comprises removing about one third of its thickness.

4. A method according to claim 1, further comprising removing the screening layer; and wherein the remaining outer peripheral portions of the adjacent areas form protrusions that serve as barriers for the memory array area when subsequent layers are formed.

5. A method according to claim 1, further comprising:

forming a base layer on the semiconductor substrate before the first layer is formed; and forming an intermediate layer on the first layer before the second layer is formed.

6. A method according to claim 5, wherein the base layer and the intermediate layer each comprises a dielectric layer.

7. A method according to claim 5, further comprising:

forming in the first layer of the memory array area floating gate regions for memory cells; and forming in the second layer of the memory array area control gate regions for the memory cells.

8. A method according to claim 1, wherein the first and second layers are identical.

9. A method according to claim 1, wherein the first and second layers each comprises a polysilicon layer.

10. A method according to claim 1, further comprising:

forming a memory array in the first and second layers in the memory array area; and forming control circuitry in the second layer on the adjacent areas of the semiconductor substrate for controlling the memory array.

11. A method of manufacturing a non-volatile memory device comprising:

forming a memory array area on a semiconductor substrate, the memory array area comprising a first conducting layer;

depositing a dielectric layer on the first conducting layer;

depositing a second conducting layer on the dielectric layer and on adjacent areas of the semiconductor substrate contacting the memory array area, the second conducting layer having a thickness that is substantially equal over the memory array area and over the adjacent areas;

forming a screening layer on the second conducting layer on the adjacent areas except for outer peripheral portions thereof adjacent the memory array area; and reducing the thickness of the second conducting layer exposed on the memory array area and on the outer peripheral portions of the adjacent areas so that an upper surface thereof is substantially coplanar with an upper surface of the second layer on the adjacent areas.

12. A method according to claim 11, wherein reducing the thickness of the second layer comprises dry etching the exposed second layer.

13. A method according to claim 11, further comprising removing the screening layer; and wherein the remaining outer peripheral portions of the adjacent areas form protrusions that serve as barriers for the memory array area when subsequent layers are formed.

14. A method according to claim 11, further comprising forming a dielectric layer on the semiconductor substrate before the first conducting layer is formed.

15. A method according to claim 11, further comprising:

forming in the first conducting layer of the memory array area floating gate regions for memory cells; and forming in the second conducting layer of the memory array area control gate regions for the memory cells.

16. A method according to claim 11, wherein the first and second conducting layers each comprises a polysilicon layer.

17. A method according to claim 11, further comprising:

forming a memory array in the first and second conducting layers in the memory array area; and forming control circuitry in the second conducting layer on the adjacent areas of the semiconductor substrate for controlling the memory array.

18. A method of manufacturing a memory device comprising:

forming a memory array area on a semiconductor substrate, the memory array area comprising a first conducting layer;

depositing a dielectric layer on the first conducting layer;

depositing a second conducting layer on the dielectric layer and on adjacent areas of the semiconductor substrate contacting the memory array area, the second conducting layer having a thickness that is substantially equal over the memory array area and over the adjacent areas;

forming a screening layer on the second conducting layer on the adjacent areas except for outer peripheral portions thereof adjacent the memory array area; and reducing the thickness of the second conducting layer exposed on the memory array area and on the outer peripheral portions of the adjacent areas so that an upper surface thereof is substantially coplanar with an upper surface of the second layer on the adjacent areas, the remaining outer peripheral portions of the adjacent areas forming protrusions serving as barriers for the memory array area when subsequent layers are formed.

19. A method according to claim 18, wherein reducing the thickness of the second layer comprises dry etching the exposed second layer.

20. A method according to claim 18, further comprising removing the screening layer.

21. A method according to claim 18, further comprising forming a dielectric layer on the semiconductor substrate before the first conducting layer is formed.

22. A method according to claim 21, further comprising:

forming in the first conducting layer of the memory array area floating gate regions for memory cells; and forming in the second conducting layer of the memory array area control gate regions for the memory cells.

23. A method according to claim 18, wherein the first and second conducting layers each comprises a polysilicon layer.

24. A method according to claim 18, further comprising:

forming a memory array in the first and second conducting layers in the memory array area; and forming control circuitry in the second conducting layer on the adjacent areas of the semiconductor substrate for controlling the memory array.

* * * * *